United States Patent
Yang et al.

(10) Patent No.: US 8,093,665 B2
(45) Date of Patent: Jan. 10, 2012

(54) SEMICONDUCTOR DEVICE AND METHOD FOR FABRICATING THE SAME

(75) Inventors: I-Chen Yang, Hsinchu (TW); Guan-Wei Wu, Hsinchu (TW); Yao-Wen Chang, Hsinchu (TW); Tao-Cheng Lu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 12/467,479

(22) Filed: May 18, 2009

(65) Prior Publication Data

US 2010/0289093 A1    Nov. 18, 2010

(51) Int. Cl.
*H01L 29/76* (2006.01)
*H01L 29/94* (2006.01)

(52) U.S. Cl. ........ 257/408; 257/411; 257/623; 438/299; 438/301

(58) Field of Classification Search .................. 257/408, 257/411, 623, E21.409, E21.385, E21.438; 438/299, 301, 303
See application file for complete search history.

(56) References Cited

U.S. PATENT DOCUMENTS

| | | | | |
|---|---|---|---|---|
| 5,994,747 | A * | 11/1999 | Wu | 257/408 |
| 7,566,624 | B2 * | 7/2009 | Leitner et al. | 438/299 |
| 2003/0098479 | A1 * | 5/2003 | Murthy et al. | 257/288 |
| 2006/0138398 | A1 | 6/2006 | Shimamune et al. | |
| 2007/0034945 | A1 * | 2/2007 | Bohr et al. | 257/338 |
| 2008/0001260 | A1 | 1/2008 | Zhu et al. | |

FOREIGN PATENT DOCUMENTS

| | | |
|---|---|---|
| JP | 11-111979 | 4/1999 |
| TW | I247386 | 1/2006 |
| TW | 200623414 | 7/2006 |
| TW | 200818499 | 4/2008 |

* cited by examiner

*Primary Examiner* — Theresa T Doan
(74) *Attorney, Agent, or Firm* — J.C. Patents

(57) ABSTRACT

A semiconductor device is described, which includes a substrate, a gate structure, doped regions and lightly doped regions. The substrate has a stepped upper surface, which includes a first surface, a second surface and a third surface. The second surface is lower than the first surface. The third surface connects the first surface and the second surface. The gate structure is disposed on the first surface. The doped regions are configured in the substrate at both sides of the gate structure and under the second surface. The lightly doped regions are configured in the substrate between the gate structure and the doped regions, respectively. Each lightly doped region includes a first part and a second part connecting with each other. The first part is disposed under the second surface, and the second part is disposed under the third surface.

10 Claims, 9 Drawing Sheets

SEMICONDUCTOR DEVICE AND METHOD FOR FABRICATING THE SAME

BACKGROUND OF THE INVENTION

1. Field of the Invention

The present invention generally relates to a semiconductor device and a method for fabricating the same, and in particular, to a metal oxide semiconductor (MOS) transistor and the fabricating method thereof.

2. Description of Related Art

Along with rapid progress of semiconductor technology, the dimensions of semiconductor devices are reduced and the integrity thereof is promoted continuously to further advance the operating speed and performance of the integrated circuit. As the demand for device integrity is raised, dramatic changes in the device characteristics, e.g. current leakage, hot carrier effect and short channel effect (SCE), have to be considered so as to avoid a great impact on reliability and performance of the circuit.

Taking a MOS transistor as an example, FIG. 1 is a schematic cross-sectional view illustrating a conventional MOS transistor. As shown in FIG. 1, a gate structure 102 is disposed on a substrate 100. A pair of spacers 104 is disposed on the sidewalls of the gate structure 102. A pair of the source drain extension (SDE) offset spacers 106 are formed between the gate structure 102 and the spacers 104, and also between the spacers 104 and the substrate 100. A source region 108a and a drain region 108b, jointly as source drain (SD), are disposed in the substrate 100 at respective outer sides of the spacers 104. A source extension region 110a and a drain extension region 110b, jointly as the SDE, are disposed in the substrate 100 under the spacers 104. In other words, the source extension region 110a is deployed between the source region 108a and the gate structure 102, while the drain extension region 110b is deployed between the drain region 108b and the gate structure 102. A salicide layer 112 is disposed on the gate structure 102, the source region 108a and the drain region 108b.

Considering the concentration of the source and drain extension regions 110a and 110b, which play important roles on the device performance, the dosage for the source and drain extension regions 110a and 110b must be heavy enough to ensure the performance of the device. The heavily-doped source and drain extension regions 110a and 110b, however, results in higher gate-induced drain leakage (GIDL) current and severe hot carrier effect. Although GIDL and hot carrier effect can be reduced by decreasing the dosage of the SDE, the sheet resistance and gate-drain overlap capacitance thereof are raised; which affect device performance significantly. Furthermore, spacers 104 must be thick enough to prevent the dopant in the source and drain regions 108a and 108b from diffusing to the SDE, and sufficient space has to be reserved for the SD diffusion so that punch through and short channel effect (SCE) can be well suppressed. Besides, when a stress liner film may be formed on the substrate 100, the stress liner film lies apart from the channel region due to the thicker spacers 104. Accordingly, the mobility enhancement attributed to the stress liner film is degraded.

As a result, how to effectively ensure the reliability and also enhance the device performance is one of the immediate issues to be solved in the art.

SUMMARY OF THE INVENTION

Accordingly, the present invention is directed to a semiconductor device with an enhanced performance.

The present invention is also directed to a method for fabricating a semiconductor device, in which tilted and bended SDE regions are formed.

The semiconductor device of the present invention includes a substrate, a gate structure, doped regions and lightly doped regions. The substrate has a stepped upper surface, which includes a first surface, a second surface and a third surface. The second surface is lower than the first surface. The third surface connects the first surface and the second surface. The gate structure is disposed on the first surface. The doped regions are configured in the substrate at both sides of the gate structure and under the second surface. The lightly doped regions are configured in the substrate between the gate structure and the doped regions, respectively. Each lightly doped region includes a first part and a second part connecting with each other. The first part is disposed under the second surface, and the second part is disposed under the third surface.

According to an embodiment of the present invention, the third surface is slanted relative to the first surface, and an extending direction of the first surface and the third surface form an included angle within a range of 45° to 60°.

According to an embodiment of the present invention, the first surface is substantially parallel to the second surface.

According to an embodiment of the present invention, a level difference between the first surface and the second surface is within a range of 250 angstroms to 600 angstroms.

According to an embodiment of the present invention, a horizontal interval between the first surface and the second surface is within a range of 250 angstroms to 350 angstrom.

According to an embodiment of the present invention, a length of the first part of each lightly doped region is within a range of 50 angstroms to 150 angstroms.

According to an embodiment of the present invention, a length of the second part of each lightly doped region is within a range of 300 angstroms to 700 angstroms.

According to an embodiment of the present invention, the semiconductor device further includes a spacer, disposed on sidewalls of the gate structure and on the lightly doped regions. A thickness of the spacer is, for example, within a range of 50 angstroms to 200 angstrom. A material of the spacer can be oxide, oxynitride, nitrided oxide, nitride, or the combination of those materials.

According to an embodiment of the present invention, the semiconductor device further includes a salicide layer, disposed on the gate structure and on the doped regions.

According to an embodiment of the present invention, the semiconductor device further includes a stress layer, disposed on the substrate. The stress layer includes a nitride film providing a compressive stress or a tensile stress.

According to an embodiment of the present invention, the semiconductor device further includes a well region configured in the substrate, wherein the doped regions and the lightly doped regions are disposed in the well region.

According to an embodiment of the present invention, the semiconductor device further includes pocket (halo) implant regions configured in the substrate under the gate structure and adjacent to each of the doped regions, respectively. The pocket (halo) implant regions are, for example, localized pocket (halo) implant regions or multiple pocket (halo) implant regions.

The method for fabricating the semiconductor device of the present invention is described as follows. A substrate is provided, and a gate structure is formed on the substrate. A portion of the substrate is removed to form a stepped upper surface using the gate structure as a mask, wherein the stepped upper surface includes a first surface, a second surface and a third surface. The second surface is lower than the first surface. The third surface connects the first surface and the second surface. Lightly doped regions are then formed in the substrate at both sides of the gate structure. Each lightly doped region includes a first part and a second part connecting with each other. The first part is formed under the second surface, and the second parties formed under the third surface. Doped regions are formed in the substrate under the second surface and adjacent to the lightly doped regions.

According to an embodiment of the present invention, the third surface is slanted relative to the first surface, and an extending direction of the first surface and the third surface form an included angle within a range of 45° to 60°.

According to an embodiment of the present invention, the first surface is substantially parallel to the second surface.

According to an embodiment of the present invention, a level difference between the first surface and the second surface is within a range of 250 angstroms to 600 angstroms.

According to an embodiment of the present invention, a horizontal interval between the first surface and the second surface is within a range of 250 angstroms to 350 angstrom.

According to an embodiment of the present invention, a length of the first part of each lightly doped region is within a range of 50 angstroms to 150 angstroms.

According to an embodiment of the present invention, a length of the second part of each lightly doped region is within a range of 300 angstroms to 700 angstroms.

According to an embodiment of the present invention, the method further includes forming a first spacer on sidewalls of the gate structure and on the lightly doped regions. A thickness of the first spacer can be within a range of 50 angstroms to 200 angstrom.

According to an embodiment of the present invention, a method for forming the first spacer may be carried out by following steps. A spacer material layer is formed on the substrate. A second spacer is formed on the sidewalls of the gate structure, wherein the second spacer covers a portion of the spacer material layer overlapping the lightly doped regions. A portion of the spacer material layer is removed using the second spacer as a mask, and the second spacer is then removed.

According to an embodiment of the present invention, the doped regions are formed using the second spacer as a mask after a portion of the spacer material layer is removed. The lightly doped regions can be formed after the spacer material layer is formed and before the second spacer is formed. Alternatively, the lightly doped regions can be formed after the second spacer is removed.

According to an embodiment of the present invention, the lightly doped regions and the doped regions are formed after the first spacer is formed. The lightly doped regions and the doped regions can be formed in a single process. Alternatively, the lightly doped regions and the doped regions are formed in a two-stepped process.

According to an embodiment of the present invention, the method further includes forming a salicide layer on the gate structure and on the doped regions.

According to an embodiment of the present invention, the method further includes forming a stress layer on the substrate. The stress layer may include a nitride film providing a compressive stress or a tensile stress.

According to an embodiment of the present invention, the method further includes forming a well region in the substrate before the gate structure is formed, wherein the doped regions and the lightly doped regions are formed in the well region.

According to an embodiment of the present invention, the method further includes forming pocket (halo) implant regions in the substrate under the gate structure and adjacent to each of the doped regions, respectively. The pocket (halo) implant regions are, for example, localized pocket (halo) implant regions or multiple pocket (halo) implant regions. The pocket (halo) implant regions can be formed after the stepped upper surface is formed, or formed after the lightly doped regions are formed, or formed after the spacer material layer is formed and before the lightly doped regions are formed.

As mentioned above, the semiconductor device in the present invention has the lightly doped regions as SDE, and hot carrier effect can therefore be alleviated by the tilted and bended SDE without lightening the concentration of the lightly doped regions. Additionally, GIDL current and gate-drain overlap capacitance can be reduced due to the disposition of the tilted and bended SDE.

Moreover, the method for fabricating the semiconductor device in the present invention forms the lightly doped regions with a tilted and bended profile, so that the diffusion of the lightly doped regions is not affected by the doped regions thereby the spacer able to be thinner in this structure of the semiconductor device. Hence, the stress layer can be closer to the channel region and the performance of the device can be improved owing to the thinner spacer.

In order to make the aforementioned and other features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
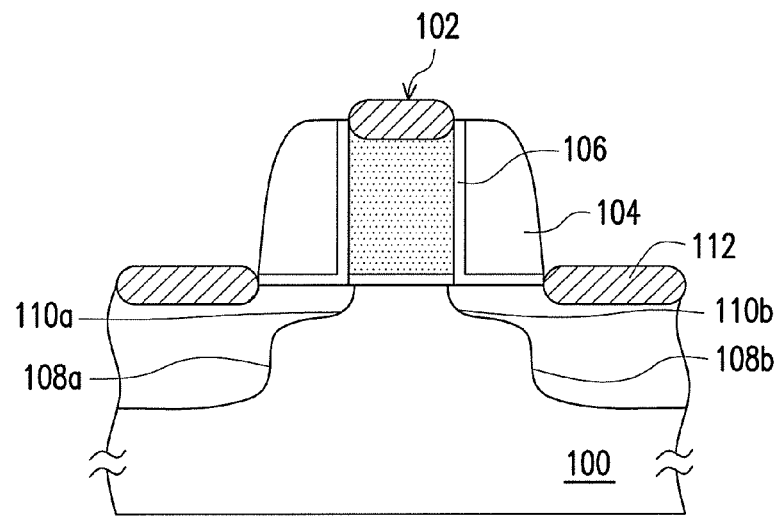
FIG. 1 is a schematic cross-sectional view illustrating a conventional MOS transistor.

Reference will now be made in detail to the present preferred embodiments of the invention, examples of which are illustrated in the accompanying drawings. Wherever possible, the same reference numbers are used in the drawings and the description to refer to the same or like parts.

Figure 2:
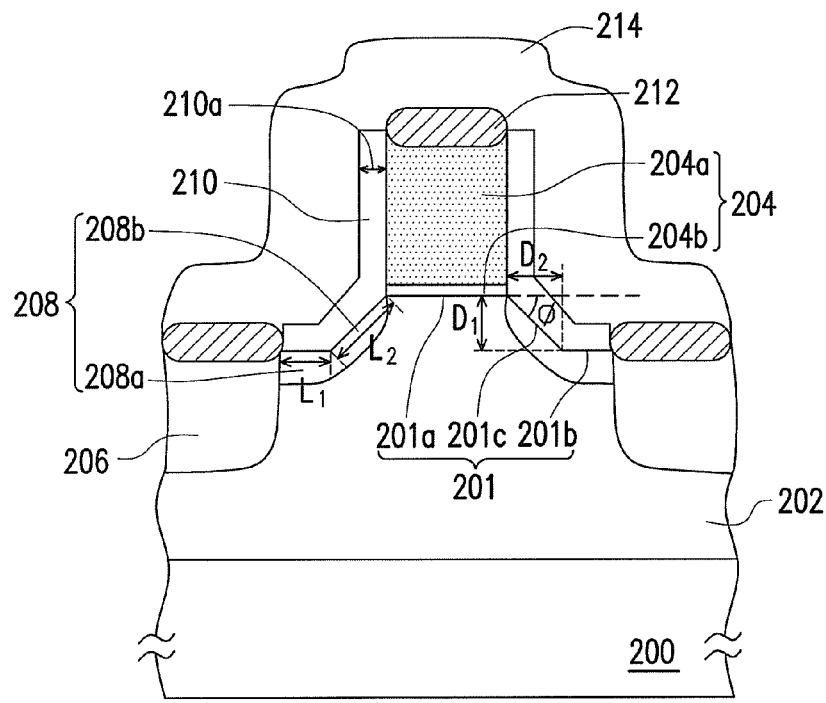
FIG. 2 schematically illustrates a cross-sectional diagram of the semiconductor device according to an embodiment of the present invention.

FIG. 2 schematically illustrates a cross-sectional diagram of the semiconductor device according to an embodiment of the present invention. It is noted that the following embodiments in which the first conductivity type is P-type and the second conductivity type is N-type is provided for illustration purposes, and should not be construed as limiting the scope of the present invention. It is appreciated by persons skilled in the art that the first conductivity type can be N-type and the second conductivity type can be P-type.

Referring to FIG. 2, the semiconductor device of the present invention at least includes a substrate 200, a gate structure 204, doped regions 206 and lightly doped regions 208. The substrate 200 of the first conductivity type is provided, which may be a P-type silicon substrate, a P-type epi-silicon substrate or a P-type semiconductor-on-insulator (SOI) substrate. The substrate 200 has a stepped upper surface 201, for example. The stepped upper surface 201 includes a first surface 201a, a second surface 201b and a third surface 201c, wherein the third surface 201c connects the first surface 201a and the second surface 201b. The second surface 201b which is lower than the first surface 201a may be substantially parallel to the first surface 201a. The third surface 201c can be slanted or tilted relative to the first surface 201a, while the first surface 201a and the second surface 201b are substantially flat. That is to say, the third surface 201c is a slope between the first surface 201a and the second surface 201b, of which the upper boundary joins the first surface 201a and the lower boundary joins the second surface 201b. In an embodiment, a level difference $D_1$ between the first surface 201a and the second surface 201b is within a range of 250 angstroms to 600 angstroms. In an embodiment, a horizontal interval $D_2$ between the first surface 201a and the second surface 201b is within a range of 250 angstroms to 350 angstrom. In an embodiment, an extending direction of the first surface 201a and the third surface 201c form an included angle $\phi$ within a range of 45° to 60°.

In addition, a well region 202 of the first conductivity type, e.g. a P-well, may be configured in the substrate 200. In an embodiment, localized pocket (halo) implant regions or multiple pocket (halo) implant regions of the first conductivity type (i.e. P-type) can further be disposed in the well region 202. The localized pocket (halo) implant regions or the multiple pocket (halo) implant regions are, for example, disposed under the gate structure 204 and adjacent to each of the doped regions 206, respectively. The well region 202 is, for example, a super steep retrograde (SSR) well only. In another embodiment, the well region 202 can also be a combination of SSR and pocket (halo) implant regions.

The gate structure 204 is disposed on the first surface 201a. The length of the gate structure 204 may correspond with that of the first surface 201a. The gate structure 204, for example, includes a gate 204a and a gate dielectric layer 204b, wherein the gate dielectric layer 204b is disposed between the gate 204a and the substrate 200. The length of the gate 204a can be down to 90 nm or even smaller. The material of the gate 204a may be metal, doped polysilicon, silicon-germanium or a combination of polysilicon and metal. The effective oxide thickness (EOT) of the gate dielectric layer 204b is, for example, around 20 angstroms to 35 angstroms, so as to suppress leakage current from the gate 204a. The material of the gate dielectric layer 204b may be oxide, nitrided oxide, oxynitride, or high-K materials, e.g. Hf, $TiO_x$, $HfO_x$, HfSiON, HfAlO and $Al_2O_3$.

The doped regions 206 of the second conductivity type are configured in the substrate 200 at both sides of the gate structure 204. The doped regions 206 are disposed under the second surface 201b. The doped regions 206 can be N+ doped regions, which serve respectively as a source and a drain of the semiconductor device.

The lightly doped regions 208 of the second conductivity type are configured in the substrate 200 between the gate structure 204 and the doped regions 206. The lightly doped regions 208 with the same conductivity type as the doped regions 206 electrically connect with the doped regions 206 at their respective sides of the gate structure 204, and thus serve as the source drain extension (SDE). Each lightly doped region 208 includes a first part 208a and a second part 208b connected with each other. The first part 208a is disposed under the second surface 201b adjacent to the third surface 201c. The second part 208b is disposed under the third surface 201c and sometimes slightly extends into the region under the first surface 201a. Since the total horizontal length of each lightly doped region 208 depends upon the length of the gate 204a, the distribution of the lightly doped regions 208 can be shortened as the length of the gate 204a is scaling down. Taking the length of the gate 204a about 90 nm for example, the horizontal distribution of each lightly doped region 208 can range between 400 angstroms and 600 angstroms. In an embodiment, a length $L_1$ of the first part 208a is within a range of 50 angstroms to 150 angstroms. In an embodiment, a length $L_2$ of the second part 208b is within a range of 300 angstroms to 700 angstroms. It is noted that the tilted angle of each lightly doped region 208 is controlled within the range of 45° to 60° due to the slanted third surface 201c, so that punch characteristics can be kept.

In general, lateral electric field only depends upon the surface doping of the lightly doped regions 208. Since the lightly doped regions 208 has a tilted and bended profile which is composed of the first part 208a and the second part 208b, the first part 208a reserves space for the diffusion of the doped regions 206. The surface doping of the small lightly doped regions 208 under the first surface 201a is quite light in the structure of the proposed semiconductor device, so that hot carrier effect, gate-drain overlap capacitance and GIDL current can be alleviated greatly without reducing the dosage of the lightly doped regions 208 and degrading the resistance thereof. The doped concentration at the gate-drain overlap region is greatly reduced, so that hot carrier effect, GIDL current and gate-drain overlap capacitance can also be reduced. Furthermore, the diffusion of the lightly doped regions 208 below the gate structure 204 is independent of the diffusion of the doped regions 206, and the concentration of the doped regions 206 can therefore be sufficiently heavy and deep.

Moreover, the semiconductor device of the present invention can further include a spacer 210, a salicide layer 212 and a stress layer 214. The spacer 210 is disposed on the sidewalls of the gate structure 204 and on the lightly doped regions 208. The spacer 210, for example, has a bended contour which corresponds to the profiles of the sidewalls of the gate structure 204, the third surface 201c and a portion of the second surface 201b. In other words, the spacer 210 can isolate the sidewalls of the gate structure 204, and also cover the substrate 200 in which the lightly doped regions 208 are formed. The material of the spacer 210 may include oxide, oxynitride, nitrided oxide, nitride, or the combination of those materials. In an embodiment, a thickness 210a of the spacer 210 is within a range of 50 angstroms to 200 angstrom.

The salicide layer 212 is disposed on the gate structure 204 and on the doped regions 206. The material of salicide layer 212 can be $NiSi_x$ or $CoSi_x$. In an embodiment, contact plugs (not shown) may further be formed on the gate structure 204 and on the doped regions 206, such that the resistance at the interface can be reduced due to the disposition of the salicide layer 212.

The stress layer 214 is disposed on the gate structure 204 and on the substrate 200. The stress layer 214 can be a nitride film that provides a compressive stress or a tensile stress to the channel region. In an embodiment, a nitride film for inducing tensile-strain in the channel region is applied to NMOS, while a nitride film for inducing compressive-strain in the channel region is applied to PMOS. For 90 nm technology, a thickness of the stress layer 214, for example, ranges between about 400 angstroms and 1000 angstroms. In general, the thickness 210a of the spacer 210 is one of the major concerns for the short channel effect. The spacer thickness 210a, which can be thinned down to the range of 50 angstroms to 200 angstrom, shortens the space between the stress layer 214 and channel region so as to improve the device performance enhanced by the stress layer 214.

It is worthy to note that the diffusion of the lightly doped regions 208 below the gate structure 204 is independent of the diffusion of the doped regions 206, and the concentration of the doped regions 206 can therefore be sufficiently heavy and deep so as to facilitate the disposition of the salicide layer 212. Moreover, the spacer 210 is thinned down owing to the disposition of the first part 208a. The stress layer 214 can be much closer to the channel region underneath the gate structure 204 owing to the thinner spacer 210 and the concave of the substrate 200, such that mobility of carriers can be enhanced that facilitates the improvement of the device performance.

The methods for fabricating the foregoing semiconductor device according to several embodiments of this invention are then described with cross-sectional diagrams hereafter. The following fabricating methods merely demonstrate the procedures for constructing the structure of the semiconductor device shown in FIG. 2 in detail, which enable one of ordinary skill in the art to practice the present invention but are not intended to limit the scope of this invention.

FIGS. 3A-3E depict, in a cross-sectional view, a method for fabricating the semiconductor device according to an embodiment of the present invention.

Figure 3A:
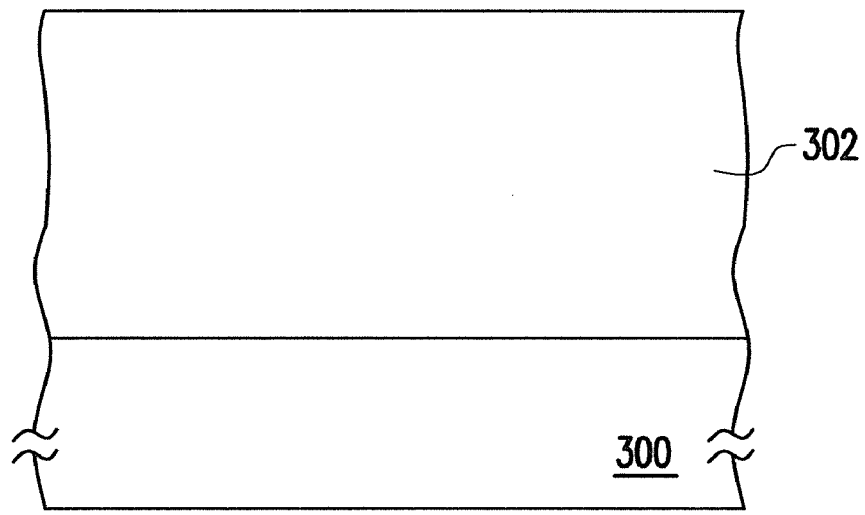
FIGS. 3A-3E depict, in a cross-sectional view, a method for fabricating the semiconductor device according to an embodiment of the present invention.

Referring to FIG. 3A, a substrate 300 of a first conductivity type is provided, which may be a P-type silicon substrate, a P-type epi-silicon substrate or a P-type semiconductor-on-insulator (SOI) substrate. A well region 302 of the first conductivity type is formed in the substrate 300, wherein the well region 302 may be a P-well. In an embodiment, the well region 302 can be formed as a super steep retrograde (SSR) configuration.

Figure 3B:
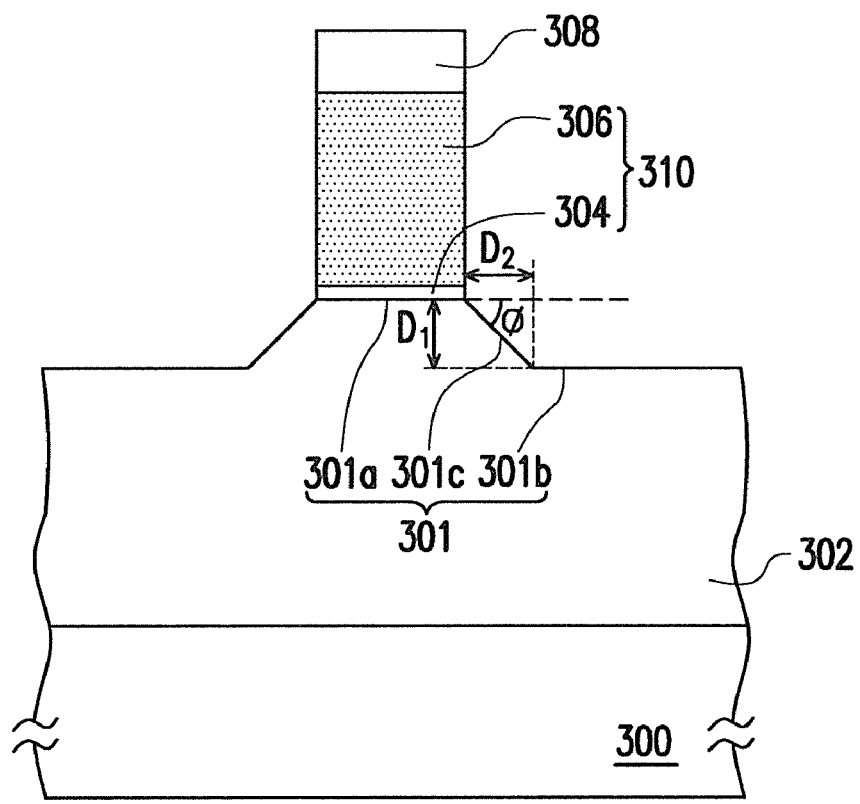

Referring to FIG. 3B, a dielectric layer 304, a conductive layer 306 and a patterned hard mask layer 308 are formed in sequence on the substrate 300. The material of the dielectric layer 304 may be oxide, nitrided oxide, oxynitride, or high-K materials, e.g. Hf, $TiO_x$, $HfO_x$, HfSiON, HfAlO and $Al_2O_3$. The material of conductive layer 306 may be metal, doped polysilicon or a combination of poly and metal. Portions of the dielectric layer 304 and the conductive layer 306 are removed using the patterned hard mask layer 308 as a mask, so as to define a gate structure 310 on the substrate 300. The patterned dielectric layer 304 serves as a gate dielectric layer, while the patterned conductive layer 306 serves as a gate. In an embodiment, the length of the gate can be down to 90 nm or even shorter, and the effective oxide thickness (EOT) of the gate dielectric layer can be around 20 angstroms to 35 angstroms to suppress the leakage current.

Afterwards, a portion of the substrate 300 is removed to form a stepped upper surface 301. The removal of the substrate 300 may be carried out by a sloped silicon etching process using the gate structure 310 as a mask. In an embodiment, the sloped silicon etching process can be carried out by wet etching with suitable recipes containing various acids. In another embodiment, the sloped silicon etching process can be carried out by plasma etching with suitable combinations of various gases, such as $CHF_3$, $CF_4$, Ar and $O_2$. The resultant stepped upper surface 301 includes a first surface 301a, a second surface 301b and a third surface 301c, wherein the third surface 301c connects the first surface 301a and the second surface 301b. The first surface 301a may correspond with the position of the gate structure 310. The second surface 301b which is lower than the first surface 301a may be substantially parallel to the first surface 301a. The third surface 301c can be slanted or tilted relative to the first surface 301a, while the first surface 301a and the second surface 301b are substantially flat. That is to say, the third surface 301c is a slope between the first surface 301a and the second surface 3201b, of which the upper boundary joins the first surface 301a and the lower boundary joins the second surface 301b. In an embodiment, a level difference $D_1$ between the first surface 301a and the second surface 301b is within a range of 250 angstroms to 600 angstroms. In an embodiment, a horizontal interval $D_2$ between the first surface 301a and the second surface 301b is within a range of 250 angstroms to 350 angstrom. In an embodiment, an extending direction of the first surface 301a and the third surface 301c form an included angle φ within a range of 45° to 60°.

Figure 3C:
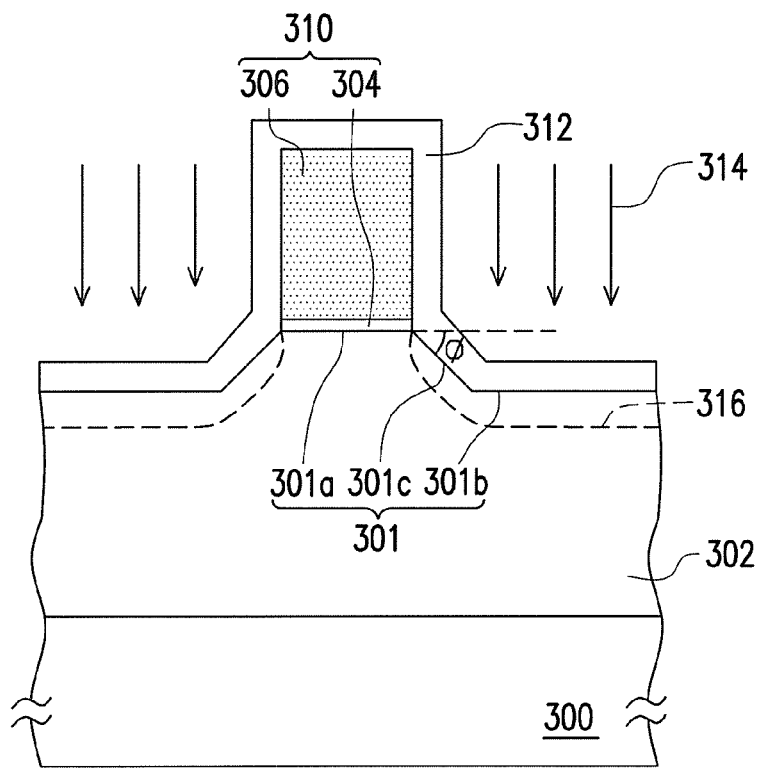

Referring to FIG. 3C, the hard mask layer 308 is removed. A spacer material layer 312 is formed on the substrate 300. The spacer material layer 312 cover the gate structure 310, the second surface 301b and the third surface 301c, for example. In an embodiment, a thickness of the spacer material layer 312 is within a range of 50 angstroms to 200 angstrom. The material of the spacer material layer 312 may include oxide, oxynitride, nitrided oxide, nitride, or the combination of those materials. The method for forming the spacer material layer 312 can be performing a deposition process or a rapid thermal process, such as an in-situ steam generation (ISSG) oxidation process.

Thereafter, an implantation process 314 is conducted to form lightly doped regions 316 of the second conductivity type (i.e. N-type) in the substrate 300 at both sides of the gate structure 310. The lightly doped regions 316 serve as a source drain extension (SDE) junction in the substrate 300. The lightly doped regions 316 can be formed by vertically implanted or, in the alternative, by implanted with a tilted angle using lower energy for shallow SDE junction depth and sufficient heavy dosage for the reduction of sheet resistance. In an embodiment, when length of the gate is about 90 nm with the spacer material layer 312 about 100 angstroms in thickness, the implantation process 314 can be conducted under the energy of 10~15 KeV with the dosage of 5e14~3e15 $cm^{-2}$, and the dopant is implanted with the tilted angle of 5°~10°. In an embodiment, when the device is even scaled down with the thinner spacer material layer 312 of 40~80 angstroms in thickness, the energy for the implantation process 314 can be lowered to 2~7 KeV.

It is noted that the implantation process 314 can also be executed after the gate structure 310 is formed and before the spacer material layer 312 is formed. Taking 90 nm technology node as an example, the energy of the implantation process 314 may be about 2~5 KeV with the dosage of 5e14~1e15 $cm^{-2}$, while the dopant is vertically implanted with the tilted angle of about 0°. For the device of which the dimensions are even scaled down, lower energy of the implantation process 314 is required, possibly about 0.1~1 KeV.

Moreover, in an embodiment, localized pocket (halo) implant regions or multiple pocket (halo) implant regions of the first conductivity type (i.e. P-type) can further be formed in the well region 302 after the stepped upper surface 301 is formed or, in the alternative, after the lightly doped regions 316 are formed. In another embodiment, the pocket (halo) implant regions may further be formed after the spacer material layer 312 is formed and before the lightly doped regions 316 are formed. In other words, the well region 302 can be a super steep retrograde (SSR) well only or a combination of SSR and pocket (halo) implant regions. The localized pocket (halo) implant regions or the multiple pocket (halo) implant regions are, for example, disposed respectively under the gate structure 310 and adjacent to each of the doped regions to be formed subsequently. The pocket regions may be formed by vertically implanted or by implanted with a tilted angle of 7°~45°.

Figure 3D:
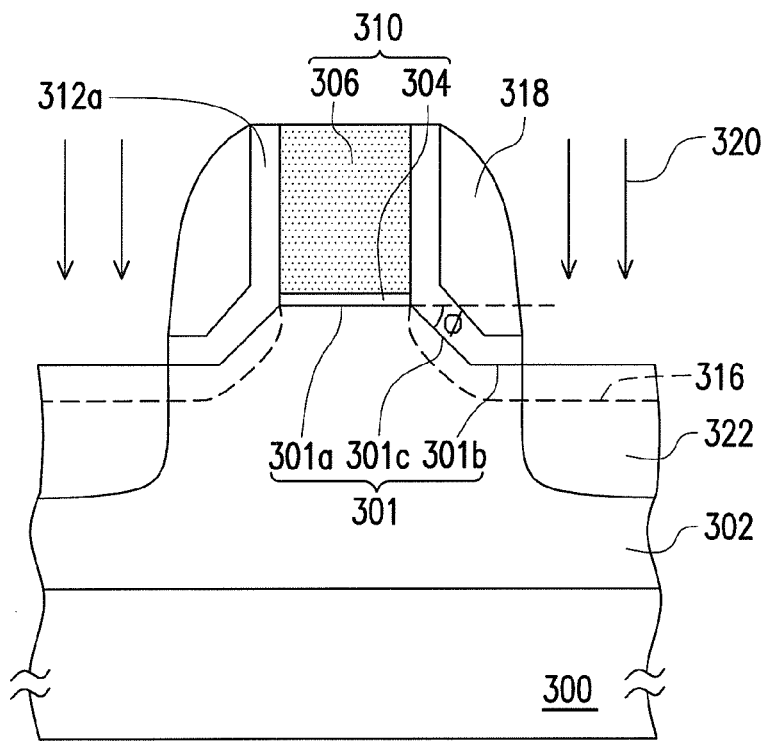

Referring to FIG. 3D, a pair of spacers 318 is then formed on the sidewalls of the gate structure 310. The spacers 318 cover a portion of the spacer material layer 312 for defining the subsequently-formed source and drain regions. A portion of the spacer material layer 312 is removed using the spacers 318 as a mask. The remaining spacer material layer 312 forms a pair of spacers 312a, each of which is disposed between the respective spacers 318 and the sidewalls of the gate structure 310. An implantation process 320 is conducted to form doped regions 322 of the second conductivity type in the substrate 300 at respective outer sides of the spacers 318. The doped regions 322 are formed under the second surface 301b and electrically connect with the lightly doped regions 316. The doped regions 322 can be N+ doped regions, which serve respectively as source and drain regions. The implantation process 320 may be vertically implanted at the energy higher than that of the implantation process 314 after the formation of spacers 318. Deep and heavy doped regions 322 facilitate the reduction of sheet resistance and the subsequent salicidation. In an embodiment, the implantation process 320 can be conducted at the energy of 10~20 KeV with the dosage of 1e15~3e15 cm$^{-2}$ for 90 nm node.

Figure 3E:
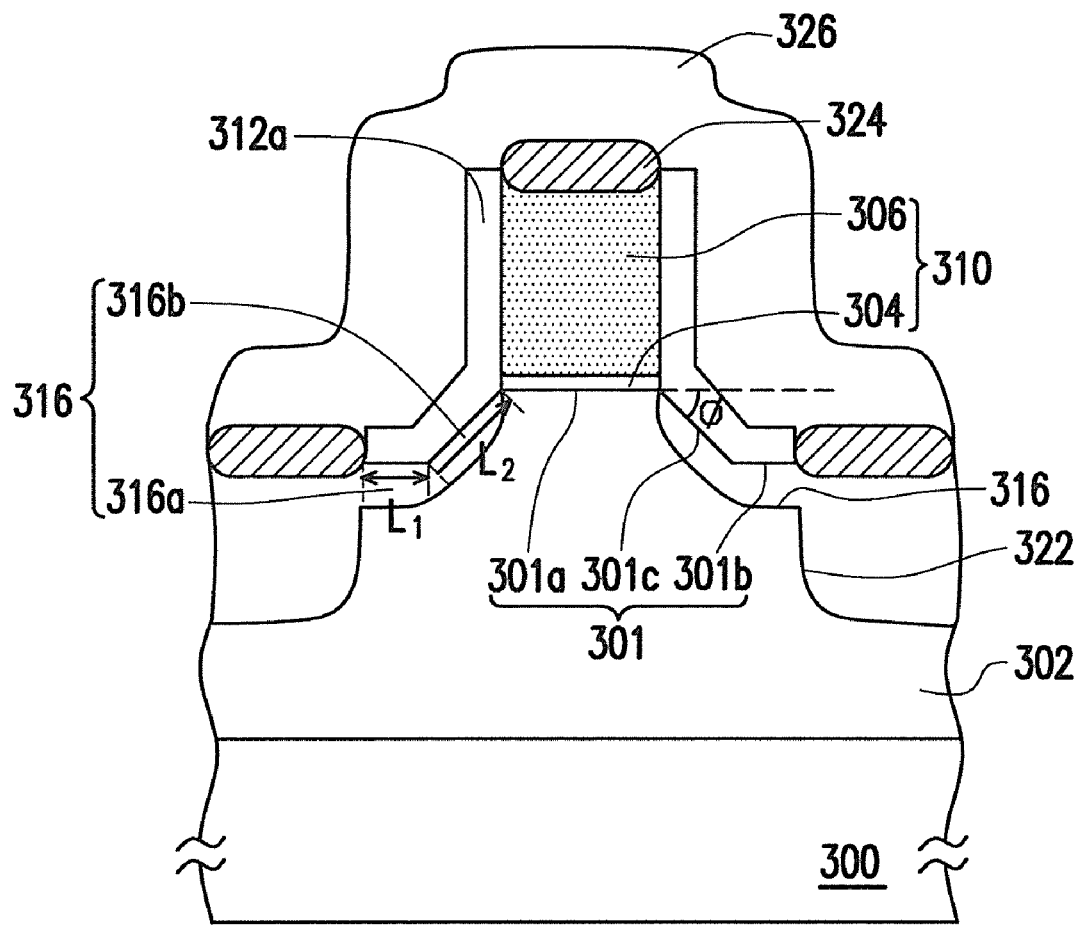

Referring to FIG. 3E, an annealing process may be further conducted to activate the dopants. In 90 nm technology node, the annealing process can be a traditional soak annealing process or a spike annealing process. For even scaled devices, further advanced annealing technology can be applied, such as a flash/laser annealing process.

Thereafter, the spacers 318 are removed. A salicide layer 324 is formed on the gate structure 310 and on the doped regions 322. The material of salicide layer 324 can be NiSi$_x$ or CoSi$_x$. In an embodiment, the salicide layer 324 can be formed after or before the removal of the spacers 318. A stress layer 326 is then formed on the substrate 300, so as to accomplish the semiconductor device of the present invention. The stress layer 326 can be a nitride film that provides a compressive stress or a tensile stress to the channel region. In this example, the stress layer 326 can provide tensile stress to the channel region of NMOS. In another example, a nitride film providing compressive stress in the channel region can serve as a stress layer applicable to PMOS. For 90 nm technology, a thickness of the stress layer 326, for example, ranges between about 400 angstroms and 1000 angstroms. It should be noted that the forming methods and forming sequences of the above-mentioned components, i.e. the salicide layer 324 and the stress layer 326, are well appreciated by persons skilled in the art, and thus, the detailed descriptions thereof are not described herein.

Referring to FIG. 3E again, each lightly doped region 316 configured in the substrate 300 between the gate structure 310 and the respective doped region 322 includes a first part 316a and a second part 316b which connect with each other, so as to form a tilted and bended profile. The first part 316a is disposed under the second surface 301b adjacent to the third surface 301c. The second part 316b is disposed under the third surface 301c and further extends an extremely small region under the first surface 301a. When the length of the gate is about 90 nm, the horizontal distribution of each lightly doped region 316 can range between 400 angstroms and 600 angstroms, for example. In an embodiment, a length $L_1$ of the first part 316a is within a range of 50 angstroms to 150 angstroms. In an embodiment, a length $L_2$ of the second part 316b is within a range of 300 angstroms to 700 angstroms. It is noted that the tilted angle of each lightly doped region 316 is controlled within the range of 45° to 60° due to the slanted third surface 301c, so that punch characteristics can be kept. The tilted and bended lightly doped regions 316 exhibit lighter concentration at the surface, such that the hot carrier effect can be alleviated, and GIDL current and gate-drain overlap capacitance can be lowered without increasing the resistance of SDE. During the annealing process, the diffusion of the lightly doped regions 316 below the gate structure 310 is independent of the diffusion of the doped regions 322, which benefits from the tilted and bended configuration of the lightly doped regions 316, and therefore the concentration of the doped regions 322 can be sufficiently heavy and deep for salicidation. Moreover, the stress layer 326 is much closer to the channel region due to the thin and bended spacers 312a, and thereby the capability of performance can be enhanced effectively.

Figure 4A:
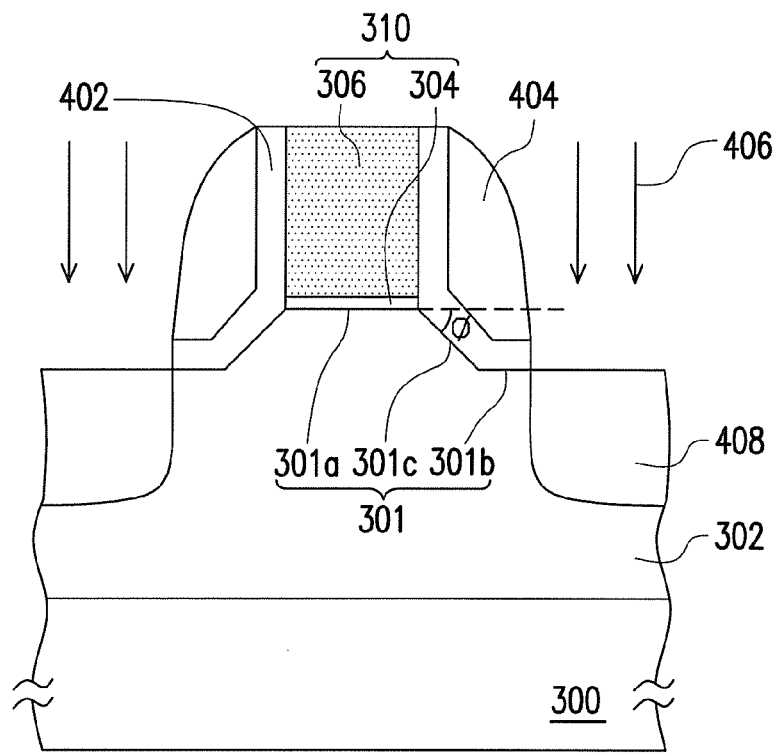
FIGS. 4A-4C depict, in a cross-sectional view, a method for fabricating the semiconductor device according to another embodiment of the present invention.
Figure 4B:
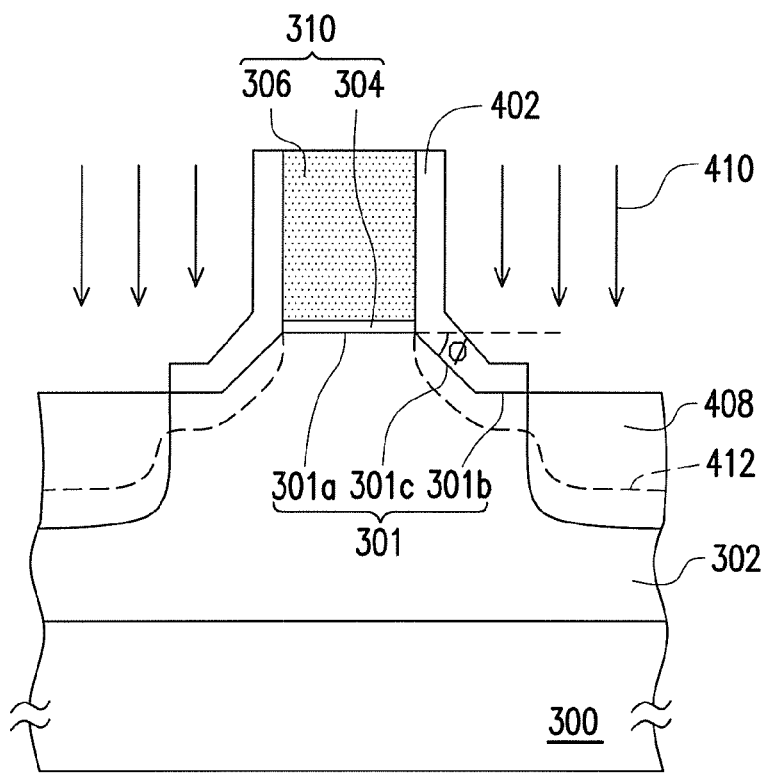
Figure 4C:
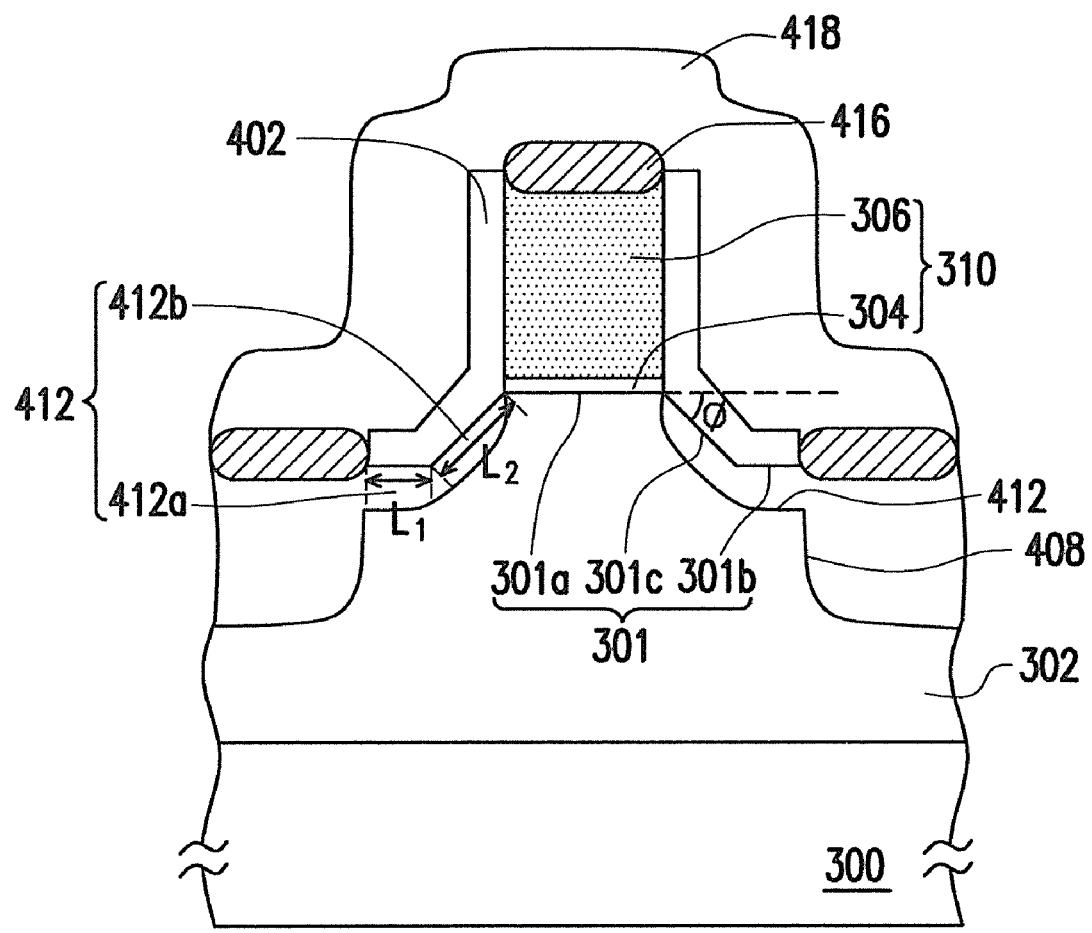

FIGS. 4A-4C depict, in a cross-sectional view, a method for fabricating the semiconductor device according to another embodiment of the present invention. It is noted that the manufacturing steps depicted in FIGS. 4A-4C follow FIG. 3B with modification. The identical elements shown in FIG. 3B and in FIGS. 4A-4C are designated with the same reference numbers, and the detailed descriptions of the same or like elements are omitted hereinafter.

Referring to FIG. 4A, the hard mask layer 308 is removed. A pair of spacers 402 and a pair of spacers 404 are formed on the sidewalls of the gate structure 310 and on a portion of the substrate 300. The bended spacers 402 can be formed by the approach of disposable spacers 404. The spacers 402 are deployed between the spacers 404 and the sidewalls of the gate structure 310, respectively. The spacers 402 and the spacers 404 cover the third surface 301c and a portion of the second surface 301b, such that the subsequently-formed source and drain regions can be defined by the spacers 402 and the spacers 404.

An implantation process 406 is conducted to form doped regions 408 of the second conductivity type in the substrate 300 at respective outer sides of the spacers 404. The doped regions 408 formed under the second surface 301b can be N+ doped regions, which serve respectively as source and drain regions. The implantation process 406 may be vertically implanted at the energy higher than that for SDE implantation. In an embodiment, the implantation process 406 can be conducted at the energy of 10~20 KeV with the dosage of 1e15~3e15 cm$^{-2}$ for 90 nm node.

Referring to FIG. 4B, the spacers 404 are removed. An implantation process 410 is conducted to form lightly doped regions 412 of the second conductivity type (i.e. N-type) in the substrate 300 at both sides of the gate structure 310. The lightly doped regions 412 can be formed by vertically implanted or, in the alternative, or implanted with a tilted angle using lower energy. In an embodiment, when length of the gate is about 90 nm with the spacers 402 about 100 angstroms in thickness, the implantation process 410 can be conducted under the energy of 10~15 KeV with the dosage of 5e14~3e15 cm$^{-2}$, and the dopant is implanted with the tilted angle of 5° In an embodiment, when the device is even scaled down with the thinner spacers 402 of 40~80 angstroms in thickness, the energy for the implantation process 410 can be lowered to 2~7 KeV.

Referring to FIG. 4C, an annealing process can be further conducted to activate the dopants. Afterwards, a salicide layer 416 is formed on the gate structure 310 and on the doped regions 408. A stress layer 418 is then formed on the substrate 300, so as to accomplish the semiconductor device of the present invention. As shown in FIG. 4C, each lightly doped region 412 configured in the substrate 300 between the gate structure 310 and the respective doped region 408 includes a first part 412a and a second part 412b which connect with each other. The first part 412a is disposed under the second surface 301b adjacent to the third surface 301c. The second part 412b is disposed under the first surface 301a with an extremely small region and under the third surface 301c. When the length of the gate is about 90 nm, the horizontal distribution of each lightly doped region 412 can range between 400 angstroms and 600 angstroms, for example. In an embodiment, a length $L_1$ of the first part 412a is within a range of 50 angstroms to 150 angstroms. In an embodiment, a length $L_2$ of the second part 412b is within a range of 300 angstroms to 700 angstroms. It is noted that the tilted angle of each lightly doped region 412 is controlled within the range of 45° to 60° due to the slanted third surface 301c, so that punch characteristics can be kept.

Figure 5A:
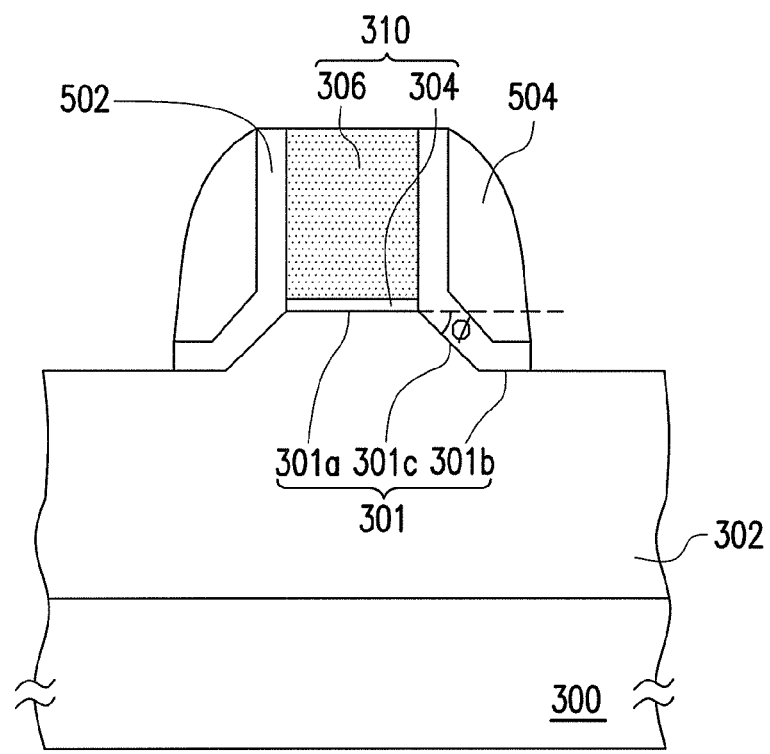
FIGS. 5A-5C depict, in a cross-sectional view, a method for fabricating the semiconductor device according to still another embodiment of the present invention.
Figures 1, 5B:
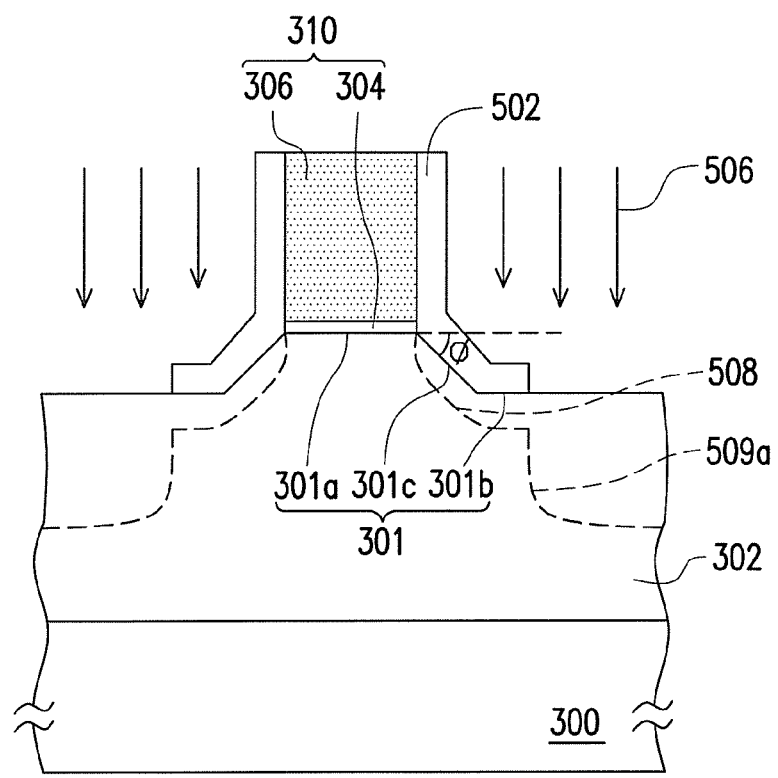
Figures 2, 5B:
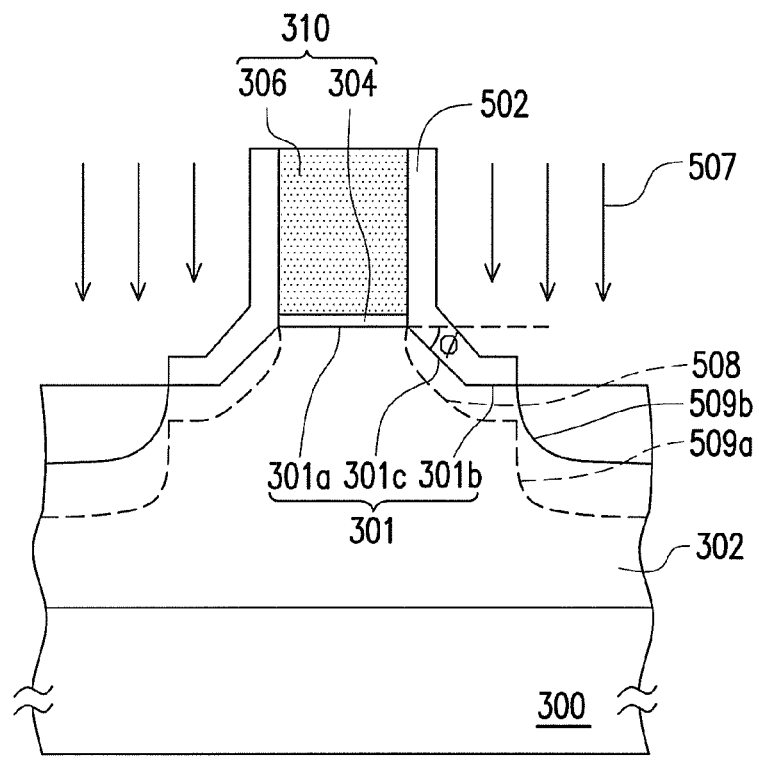
Figure 5C:
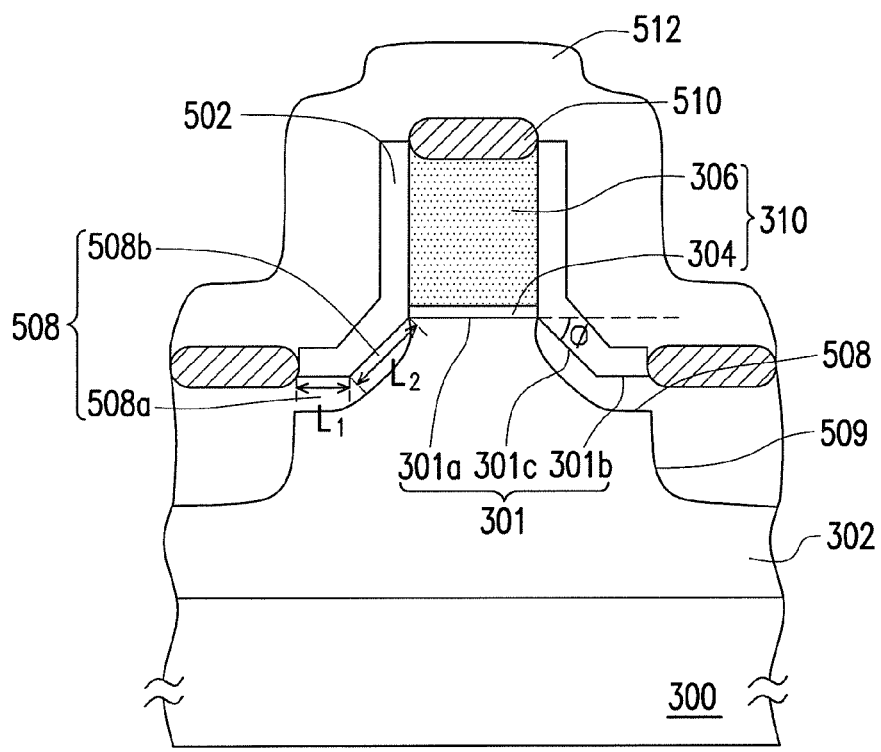

FIGS. 5A-5C depict, in a cross-sectional view, a method for fabricating the semiconductor device according to still another embodiment of the present invention. It is noted that the manufacturing steps depicted in FIGS. 5A-5C follow FIG. 3B with modification. The identical elements shown in FIG. 3B and in FIGS. 5A-5C are designated with the same reference numbers, and the detailed descriptions of the same or like elements are omitted hereinafter.

Referring to FIG. 5A, the hard mask layer 308 is removed. A pair of spacers 502 and a pair of spacers 504 are formed on the sidewalls of the gate structure 310 and on a portion of the substrate 300. The bended spacers 502 can be formed by the approach of disposable spacers 504. The spacers 502 are deployed between the spacers 504 and the sidewalls of the gate structure 310, respectively. The spacers 502 and the spacers 504 cover the third surface 301c and a portion of the second surface 301b, so as to define the subsequently-formed SDE, source and drain regions.

Referring to FIG. 5B-1, the spacers 504 are removed. An implantation process 506 is conducted to form lightly doped regions 508 and doped regions 509a of the second conductivity type (i.e. N-type) in the substrate 300 at both sides of the gate structure 310. The lightly doped regions 508 are formed under the spacers 502, while the doped regions 509a are formed at both outer sides of the spacers 502.

Referring to FIG. 5B-2, in another embodiment, an implantation process 507 may be further conducted using a lower energy to form doped regions 509b of the second conductivity type (i.e. N-type) in the substrate 300 at both sides of the gate structure 310 for deepening the SD diffusion regions. The doped regions 509b are, for example, formed within the doped regions 509a. It should be noticed that the sequence of performing the implantation process 506 and performing the implantation process 507 is not particularly limited in the present invention, that is, the sequence of the implantation processes 506 and 507 can be exchanged.

That is to say, the shallow SDE regions and the SD diffusion regions can be formed by conducting a single implantation process with a suitable energy or by conducting a double implantation process that implants the substrate 300 twice. In an embodiment, during the single implantation process for the simultaneous formation of the lightly doped regions 508 and the doped regions 509a, the lightly doped regions 508 are formed as a shallow junction due to the coverage of the spacers 502 while the doped regions 509a are formed as a deep junction without the screened spacers 502, as shown in FIG. 5B-1. Taking 90 nm technology node with the spacers 502 about 100 angstroms in thickness as an example, the energy of the single implantation process may be about 15 KeV with the dosage of 1e15~3e15 cm$^{-2}$ and the tilted angle of 5°~10°, such that the demanded junction profile can be formed at the same time.

In an embodiment, during the two-stepped implantation process for the formation of the lightly doped regions 508 and the doped regions 509a and 509b, the implantation process 506 forms the lightly doped regions 508 and the doped regions 509a simultaneously (as shown in FIG. 5B-1), and the other implantation process 507 with relatively lower energy only increases the concentration of the doped regions 509b owing to the disposition of the screened spacer 502 (as shown in FIG. 5B-2). Taking 90 nm technology node with the spacers 502 about 100 angstroms in thickness as an example, the implantation process 506 for the simultaneous formation of the lightly doped regions 508 and doped regions 509a can be conducted at the energy of 15 KeV with the dosage of 1e15~3e15 cm$^{-2}$ and the tilted angle of 5°~10°. In an example with the same condition, the implantation process 507 for increasing the concentration of the doped regions 509b can be conducted at the energy of 5~10 KeV with the dosage of 1e15~3e15 cm$^{-2}$.

Referring to FIG. 5C, after the implantation process 506 or the implantation process 507 is performed, an annealing process can be further conducted to activate the dopants, such that doped regions 509 may be formed. Thereafter, a salicide layer 510 is formed on the gate structure 310 and on the doped regions 408. A stress layer 512 is then formed on the substrate 300, so as to accomplish the semiconductor device of the present invention. As shown in FIG. 5C, each lightly doped region 508 configured in the substrate 300 between the gate structure 310 and the respective doped region 509 includes a first part 508a and a second part 508b which connect with each other. The first part 508a is disposed under the second surface 301b adjacent to the third surface 301c. The second part 508b is disposed under the first surface 301a with an extremely small region and under the third surface 301c. When the length of the gate is about 90 nm, the horizontal distribution of each lightly doped region 508 can range between 400 angstroms and 600 angstroms, for example. In an embodiment, a length $L_1$ of the first part 508a is within a range of 50 angstroms to 150 angstroms. In an embodiment, a length $L_2$ of the second part 508b is within a range of 300 angstroms to 700 angstroms. It is noted that the tilted angle of each lightly doped region 508 is controlled within the range of 45° to 60° due to the slanted third surface 301c, so that punch characteristics can be kept.

The following example is provided to prove that the semiconductor device of the present invention can enhance the performance of the device. This example is provided to illustrate effects upon a lateral electric field (E-field) made by the deployment of the semiconductor device in the present invention, but is not intended to limit the scope of the present invention.

Example

Figure 6:
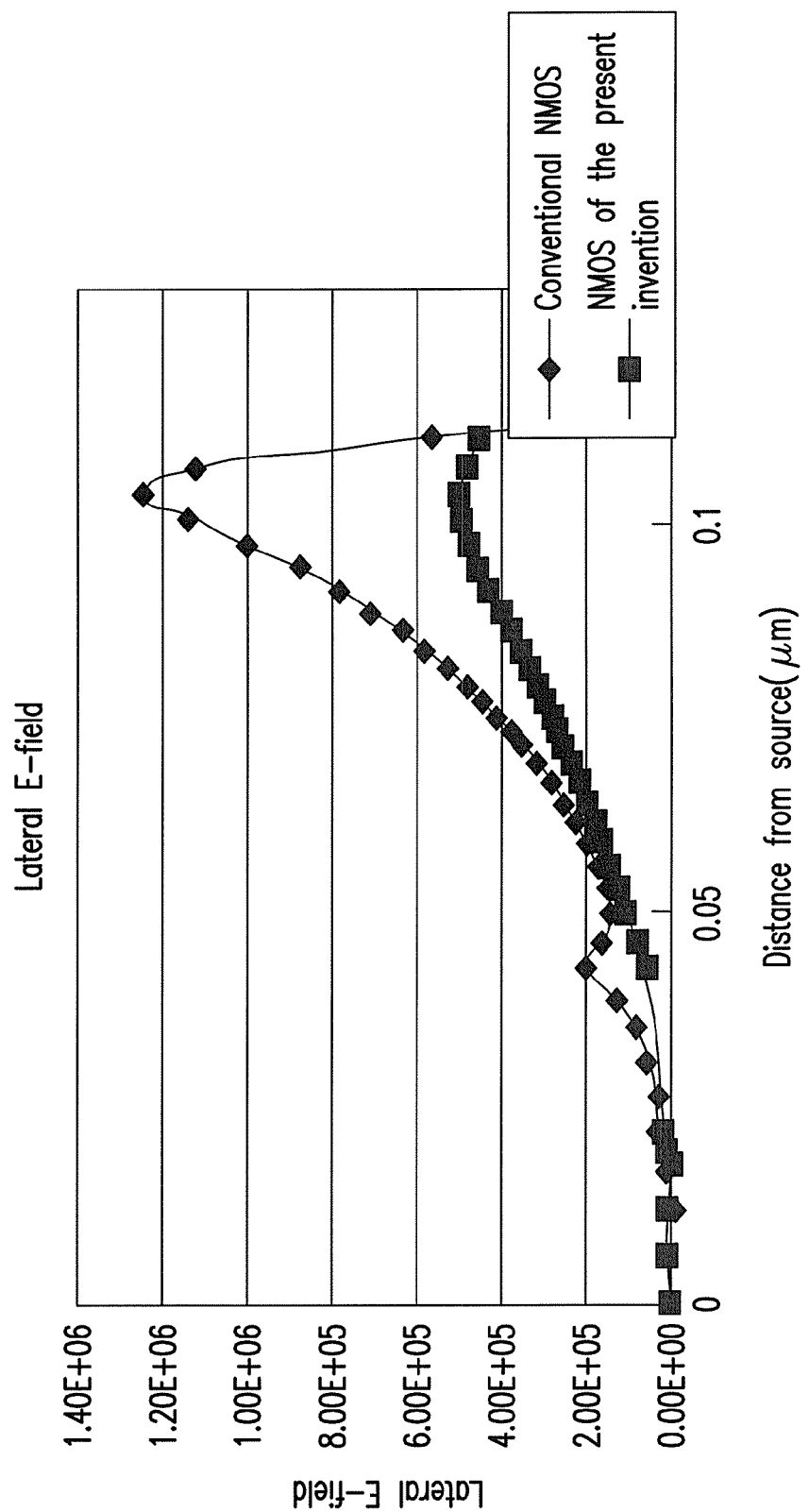
FIG. 6 schematically illustrates distribution curves of the lateral E-field versus various positions in the channel region parallel to the first surface according to the conventional NMOS and an example of the present invention.

FIG. 6 schematically illustrates distribution curves of the lateral E-field versus various positions in the channel region parallel to the first surface according to the conventional NMOS and an example of the present invention.

As shown in FIG. 6, the lateral E-field at the channel region, which approaches to the interface of the gate structure and the silicon substrate, is simulated in the convention NMOS and the proposed NMOS of the present invention, respectively. The conventional NMOS and the NMOS of the present invention have the gates with same length, e.g. 90 nm. Under the same bias applied to the devices, the distribution of the lateral E-field in the conventional NMOS is much higher than that of the NMOS of the present invention. Since the lateral E-field affects hot carrier effect greatly, the conventional NMOS with the higher lateral E-field suffers from severe hot carrier effect, thereby degrading the performance of the device. Accordingly, the lateral E-field of the NMOS structure proposed in the present invention can be effectively diminished, so that the enhancement of the device performance can be achieved.

In view of the above, the semiconductor device of the present invention includes the lightly doped regions with the first and the second parts, and such lightly doped regions in a tilted and bended form can facilitate the reduction of hot carrier effect without lightening the concentration of the lightly doped regions. Moreover, the leakage current, e.g. GIDL, and gate-drain overlap capacitance can be alleviated due to the tilted and bended lightly doped regions.

Further, the method for fabricating the semiconductor device of the present invention forms the lightly doped regions with a tilted and bended profile by means of the disposable spacers, so as to easily be incorporated into the current process. Hence, not only the process is simplified without raising the cost, the performance of the device can be more effectively improved. Besides, the method for fabricating the semiconductor device is feasible for the applications of the MOS device which is scaled down even smaller than 90 nm.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor device, comprising:
a substrate with a stepped upper surface, wherein the stepped upper surface comprises a first surface, a second surface lower than the first surface, and a third surface connecting the first surface and the second surface;
a gate structure, disposed on the first surface;
a spacer disposed on sidewalls of the gate structure, on the third surface and on the second surface;
doped regions, configured in the substrate at both sides of the gate structure and under the second surface; and
lightly doped regions, configured in the substrate between the gate structure and the doped regions, wherein each lightly doped region comprises:
a first part, disposed under the second surface, wherein the first part is not overlapped with the doped regions; and
a second part, connecting the first part and disposed under the third surface.

2. The semiconductor device according to claim 1, wherein the third surface is slanted relative to the first surface, and an extending direction of the first surface and the third surface form an included angle within a range of 45° to 60°.

3. The semiconductor device according to claim 1, wherein the first surface is substantially parallel to the second surface.

4. The semiconductor device according to claim 1, wherein a level difference between the first surface and the second surface is within a range of 250 angstroms to 600 angstroms, and a horizontal interval between the first surface and the second surface is within a range of 250 angstroms to 350 angstrom.

5. The semiconductor device according to claim 1, wherein a length of the first part of each lightly doped region is within a range of 50 angstroms to 150 angstroms, and a length of the second part of each lightly doped region is within a range of 300 angstroms to 700 angstroms.

6. The semiconductor device according to claim 1, further comprising a spacer disposed on sidewalls of the gate structure and on the lightly doped regions having a thickness within a range of 50 angstroms to 200 angstrom.

7. The semiconductor device according to claim 1, further comprising a stress layer disposed on the substrate.

8. The semiconductor device according to claim 1, further comprising pocket (halo) implant regions configured in the substrate under the gate structure and adjacent to each of the doped regions respectively, wherein the pocket (halo) implant regions are localized pocket (halo) implant regions or multiple pocket (halo) implant regions.

9. The semiconductor device according to claim 1, wherein the spacer covers the first part and the second part.

10. The semiconductor device according to claim 1, wherein the spacer has a bended contour corresponding to the profiles of the sidewalls of the gate structure, the third surface and a portion of the second surface.

* * * * *